United States Patent
Seoka et al.

(10) Patent No.: US 8,927,931 B2
(45) Date of Patent: Jan. 6, 2015

(54) SCANNING ELECTRON MICROSCOPE

(75) Inventors: Masanori Seoka, Hitachinaka (JP); Kazushige Nakagawa, Naka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/981,685

(22) PCT Filed: Nov. 11, 2011

(86) PCT No.: PCT/JP2011/006307
§ 371 (c)(1), (2), (4) Date: Jul. 25, 2013

(87) PCT Pub. No.: WO2012/120576
PCT Pub. Date: Sep. 13, 2012

(65) Prior Publication Data
US 2013/0306864 A1   Nov. 21, 2013

(30) Foreign Application Priority Data
Mar. 8, 2011   (JP) .................... 2011-049761

(51) Int. Cl.
H01J 37/28 (2006.01)
H01J 37/147 (2006.01)
H01J 37/153 (2006.01)
H01J 37/26 (2006.01)

(52) U.S. Cl.
CPC ............. *H01J 37/147* (2013.01); *H01J 37/153* (2013.01); *H01J 37/265* (2013.01); *H01J 37/28* (2013.01); *H01J 2237/221* (2013.01)

USPC .......... 250/307; 250/306; 250/310; 250/311; 250/396 R; 250/397

(58) Field of Classification Search
USPC ...... 250/306, 307, 310, 311, 396 R, 396 ML, 250/397, 398
See application file for complete search history.

(56) References Cited

U.S. PATENT DOCUMENTS 6,130,747 A * 10/2000 Nomura et al. ............ 356/239.2
6,248,486 B1 * 6/2001 Dirksen et al. ................ 430/30
6,368,763 B2 * 4/2002 Dirksen et al. ................ 430/30
6,661,515 B2 * 12/2003 Worster et al. ............... 356/394

(Continued)

FOREIGN PATENT DOCUMENTS

JP   05-190130 A   7/1993
JP   07-021961 A   1/1995

(Continued)

*Primary Examiner* — David A Vanore
(74) *Attorney, Agent, or Firm* — Mattingly & Malur, PC

(57) ABSTRACT

In conventional electron microscopes, orthogonality has been defined for each electron microscope individually in such a manner that a lattice sample is observed, and correction is applied to a control circuit so that the sample is observed as being orthogonal on a screen. Further, the correction has been determined by visual observation on a screen, and manually performed by a human operator. However, in this method, due to manufacturing variation of a lattice sample, the orthogonality may vary between devices. Further, there has been a problem in that the accuracy of correction varies by manually performing the correction. In order to solve the above problems, a particulate sample is used instead of a lattice sample for defining orthogonality, and adjustment is performed so that an image that should be a circle is observed as a circle, thereby making it possible to define the orthogonality.

2 Claims, 7 Drawing Sheets

(56) References Cited

U.S. PATENT DOCUMENTS

| | | | |
|---|---|---|---|
| 7,060,986 B2 * | 6/2006 | Nakamura et al. | 250/396 R |
| 7,095,031 B2 * | 8/2006 | Uno | 250/396 R |
| 7,136,143 B2 * | 11/2006 | Smith | 355/52 |
| 7,145,154 B2 * | 12/2006 | Uno | 250/396 R |
| 7,186,975 B2 * | 3/2007 | Ishitani et al. | 250/310 |
| 7,205,551 B2 * | 4/2007 | Uno | 250/397 |
| 7,282,722 B2 * | 10/2007 | Sato et al. | 250/398 |
| 7,345,735 B2 * | 3/2008 | Smith | 355/52 |
| 7,408,172 B2 * | 8/2008 | Sato et al. | 250/398 |
| 7,714,286 B2 * | 5/2010 | Nakano et al. | 250/310 |
| 7,872,240 B2 * | 1/2011 | Ito et al. | 250/396 R |
| 8,247,782 B2 * | 8/2012 | Edinger et al. | 250/396 R |
| 8,324,574 B2 * | 12/2012 | Own et al. | 250/311 |
| 8,581,190 B2 * | 11/2013 | Nakano et al. | 250/310 |
| 2003/0085352 A1 | 5/2003 | Lezec et al. | |
| 2007/0158568 A1 * | 7/2007 | Nakamura et al. | 250/311 |
| 2011/0139980 A1 * | 6/2011 | Nakano et al. | 250/307 |
| 2012/0132803 A1 * | 5/2012 | Hirato et al. | 250/310 |

FOREIGN PATENT DOCUMENTS

| | | |
|---|---|---|
| JP | 2005-520279 A | 7/2005 |
| JP | 2007-179753 A | 7/2007 |
| JP | 2008-171756 A | 7/2008 |

\* cited by examiner (A) • When A ≠ B $\theta \neq 90°$ (B) • When A = B $\theta = 90°$ (A)

(B)

SCANNING ELECTRON MICROSCOPE

TECHNICAL FIELD

The present invention relates to an electron microscope, and particularly provides an electron microscope having a function to calculate orthogonality and reflect the calculated result in a deflection control circuit to thereby perform automatic orthogonal correction.

BACKGROUND ART

A scanning electron microscope is a device which obtains an observation image of a target specimen in such a manner that a specimen to be observed is two-dimensionally scanned with a primary electron beam within an X-Y plane, and a secondary electron which is generated in a scan position or a reflection electron which is backscattered is detected, thereby imaging an output signal from a detector. The secondary electron or the reflection electron is generated along a trajectory of the scanning with the primary electron beam. Therefore, when an X scanning direction and a Y scanning direction are not orthogonal to each other, an obtained image is, of course, distorted.

FIG. 1 illustrates a relationship between orthogonality of scanning lines with respect to a scanning area and distortion of an image. When the scanning area in an X direction and a Y direction is not appropriate, an image is observed as a distorted image as shown in FIG. 1. In an example illustrated in FIG. 1, an object for observation is a circular specimen. For example, when the scanning area is distorted into a rhombus, an image is observed as being distorted into an ellipse. When the scanning area is an appropriate square area, the circular object is correctly observed as a circular image.

The orthogonal degree between an X scanning line and a Y scanning line is generally called "orthogonality". In an actual scanning electron microscope, the orthogonality is, required to be adjusted to the extent with which the X scanning line and the Y scanning line can be regarded as being orthogonal to each other.

In a conventional electron microscope, a lattice specimen which is manufactured independently from an electron microscope has been used, and adjustment has been performed by applying correction to a control circuit of a scanning deflector of the electron microscope so that an image of the lattice specimen is observed as being orthogonal on a display screen, assuming that the lattice specimen is orthogonal. For example, PTL 1 discloses an invention in which a SEM image is divided into a lattice, and a lattice sheet is stuck on a monitor to thereby adjust deflection distortion of respective divided areas by visual observation.

However, in the conventional technique, since there is manufacturing variation in the accuracy of a lattice specimen, and the adjustment is performed by visual observation, there has been a problem in that adjusted orthogonality may vary between electron microscopes. Further, since a correction value for the control circuit is manually input, there has been a problem of variation in the correction accuracy. In addition, when a single user uses a plurality of electron microscopes, there has sometimes been a problem caused by an apparent difference in orthogonality between the electron microscopes.

CITATION LIST

Patent Literature

PTL 1: JP 63-150842 A

SUMMARY OF INVENTION

Technical Problem

It is an object of the present invention to achieve an adjustment method of an electron microscope with less orthogonality variation than a conventional one, and an electron microscope provided with a function to perform the adjustment method.

Solution to Problem

In order to solve the above problems, in the present invention, a spherical specimen which is considered as having less manufacturing variation than a lattice specimen is used, and an algorithm which defines orthogonality from an image of the spherical specimen is employed. A correction value for a control circuit of an electron microscope is calculated using the algorithm, and automatically set to a control sequencer of a deflector.

Advantageous Effects of Invention

The present invention makes it possible to eliminate the necessity of manufacturing a lattice specimen, and easily reduce variation in orthogonality by defining the orthogonality from a spherical specimen. Further, it is possible to reduce variation in orthogonality caused by defining the orthogonality by a human operator by incorporating a function capable of performing automatic determination. As a result, effects such as reducing variation between devices and improving the performance of a device can be obtained.

DESCRIPTION OF EMBODIMENTS

Hereinafter, embodiments will be described. In the following embodiments, a particulate sample is used in a device for observing a SEM image, and the accuracy in orthogonality measurement by the device is defined by utilizing the spherical characteristics of the sample.

First Embodiment

Figure 2:
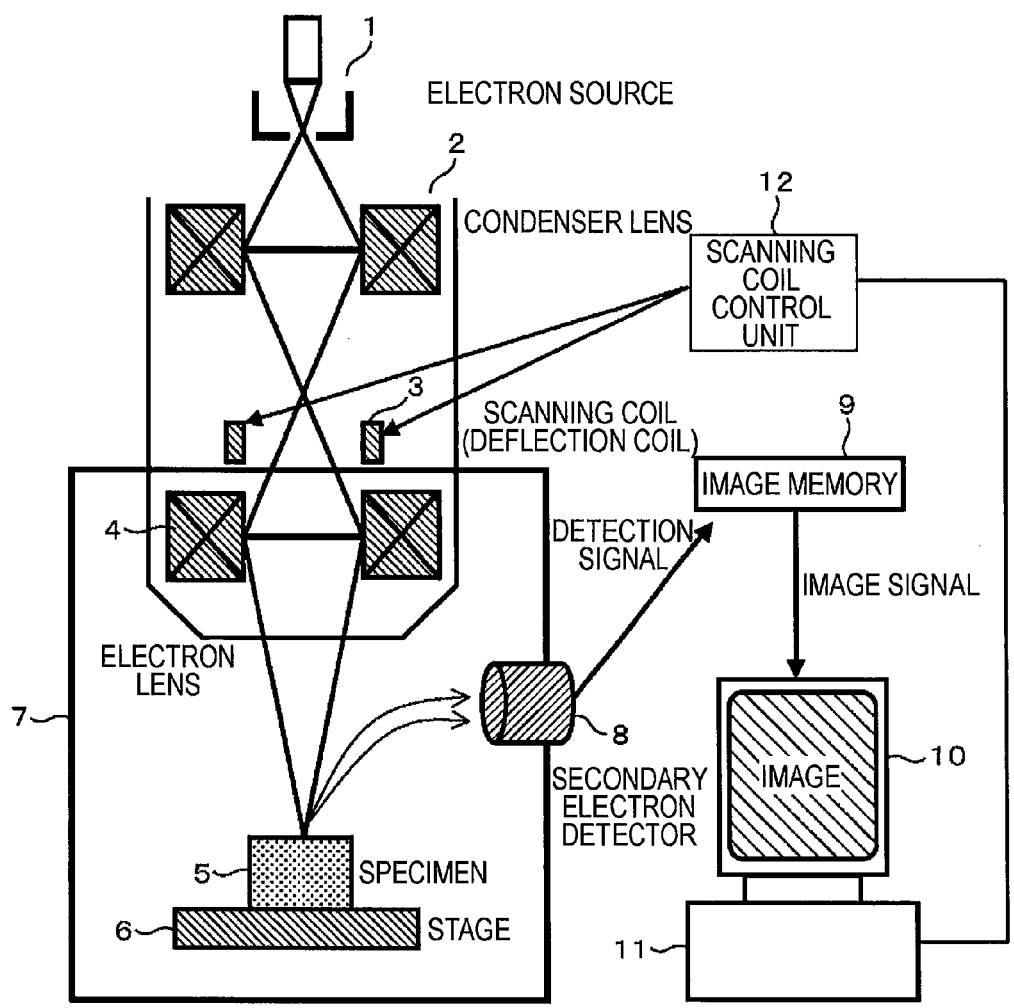
FIG. 2 is a configuration diagram of a scanning electron microscope of the present embodiment.

FIG. 2 illustrates the configuration of a scanning electron microscope of a first embodiment. An electron is accelerated and withdrawn from an electron gun 1, an electron probe is focused by a condenser lens 2, and the focus thereof is then adjusted by an electron lens 4, thereby applying the electron to a specimen on a specimen stub 5. The electron probe is positioned between the condenser lens 2 and the electron lens 4, and has a structure in which a position thereof is changed by a scanning coil 3 (a scanning deflector). The scanning coil 3 is provided with an X deflection coil which adjusts distortion of an observation image in a horizontal direction (X direction) and a Y deflection coil which adjusts distortion of the observation image in a vertical direction (Y direction), and achieves an undistorted image by adjusting a value of current to be applied to each of the X deflection coil and the Y deflection coil.

The specimen stub 5 is conveyed and placed on a specimen stage 6 by a conveyance mechanism (not shown). The specimen stub 5, the specimen stage 6 and the like are housed in a chamber 7. The inside of the chamber 7 is maintained in a vacuum state by a vacuum pumping system (not shown). A secondary electron is emitted from the specimen on the specimen stub 5 by the electron applied to the specimen. The secondary electron is detected by a secondary electron detector 8, and the detected signal is displayed on an image monitor 10 through an image memory 9, thereby observing the detected signal as a secondary electron image. The image monitor 10 is connected to a device control unit 11.

The device control unit 11 is often realized by a personal computer-based arithmetic unit. The device control unit 11 performs calculation of a correction value of orthogonality to be set in a scanning coil control unit 12, and also serves as a host device in controlling the entire scanning electron microscope. Further, input devices such as a mouse and a keyboard are connected to the device control unit 11.

Figure 1:
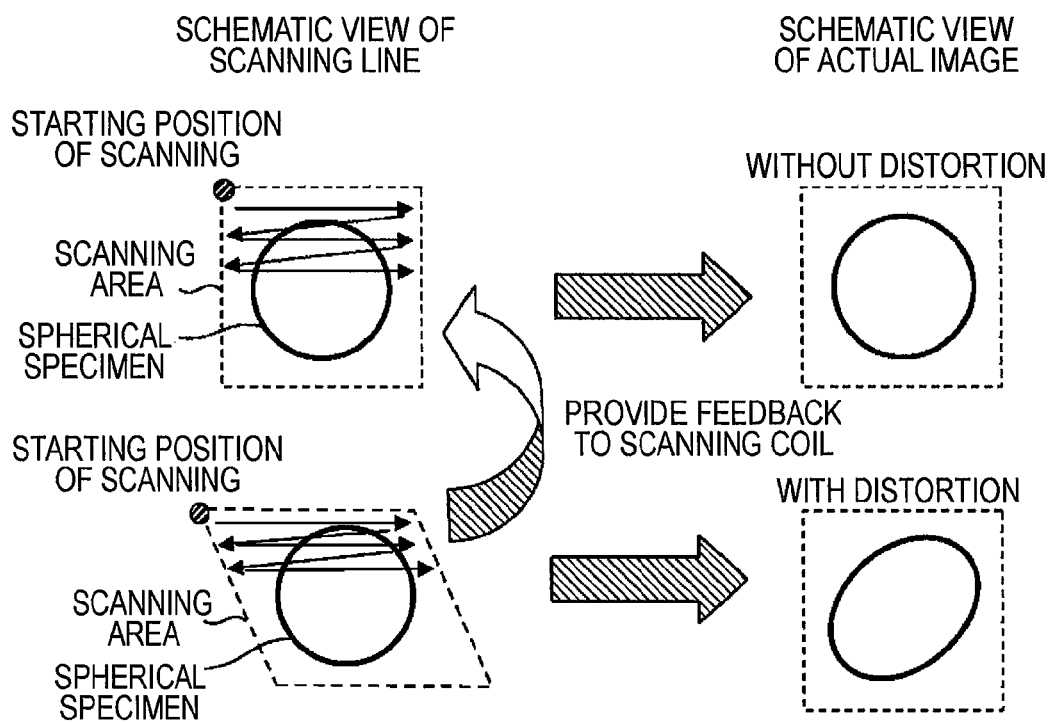
FIG. 1 is a diagram illustrating a relationship between orthogonality of scanning lines with respect to a scanning area and distortion of an image.

When the orthogonality is adjusted, a spherical specimen is placed on the specimen stub 5, and a secondary electron image of the spherical specimen is observed to thereby obtain a SEM image of the spherical specimen in the scanning electron microscope shown in FIG. 1. The device control unit 11 calculates a current correction value for the scanning coil 3 by using the SEM image of the spherical specimen. The scanning coil control unit 12 (a deflection control sequencer) is provided with a storage element such as a latch circuit and a register, and stores the calculated current correction value in the storage element. The scanning coil control unit 12 adjusts an orthogonal relationship between an X scanning line and a Y scanning line using the current correction value. This makes it possible to provide a scanning electron microscope in which the orthogonality is ensured, and observe a spherical specimen as a perfect circle.

Figure 3:
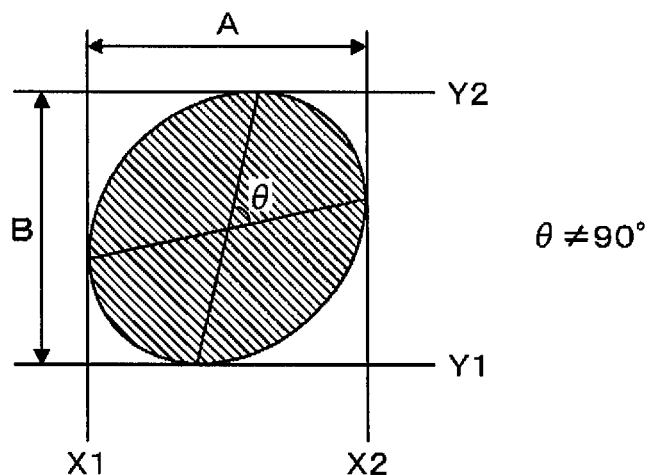
FIGS. 3(A) and 3(B) are diagrams illustrating an adjustment principle of an adjustment algorithm of a scanning deflector of a first embodiment.
Figure 3:
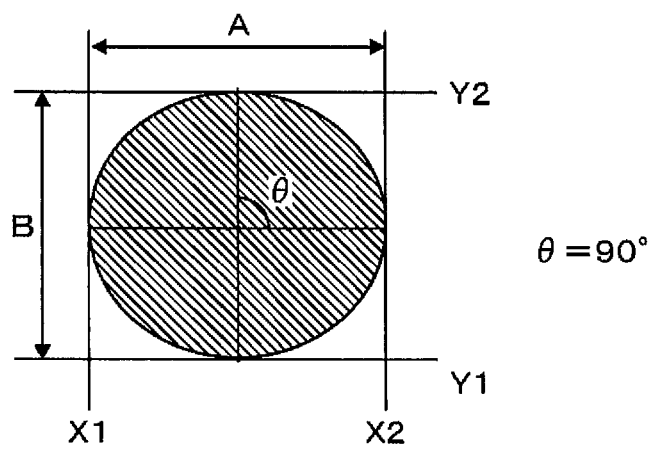

FIG. 3 illustrates a principle of an adjustment algorithm of orthogonality in the present embodiment. Consideration will be made with regard to a case where the orthogonality is not appropriate, and a distorted image of a spherical specimen as shown in FIG. 3(A) is therefore obtained. When an image of a spherical specimen is distorted, an elliptical image is obtained. In this case, a quadrangle including this ellipse as an inscribed circle becomes a rectangle. On the other hand, when the orthogonality is appropriately adjusted, an image having a shape close to a perfect circle as shown in FIG. 3(B) can be obtained as an image of the spherical specimen.

More specifically, when the length of one side of a quadrangle which is composed of tangents in four points on the outline of an actual image of the spherical specimen is not equal to the length of each of the other sides, an observation image of the spherical specimen is not observed as a circle. On the other hand, when the length of one side of the quadrangle is equal to the length of each of the other sides, the observation image of the spherical specimen is observed as a circle, which means that a scanning area of the X deflection coil and the Y deflection coil is appropriate. Therefore, it is possible to appropriately adjust the orthogonality by adjusting the scanning coil control unit 12 so that the length of one side of a quadrangle which is composed of tangents in four points on the outline of an actual image of the spherical specimen becomes equal to the length of each of the other sides.

Figure 4:
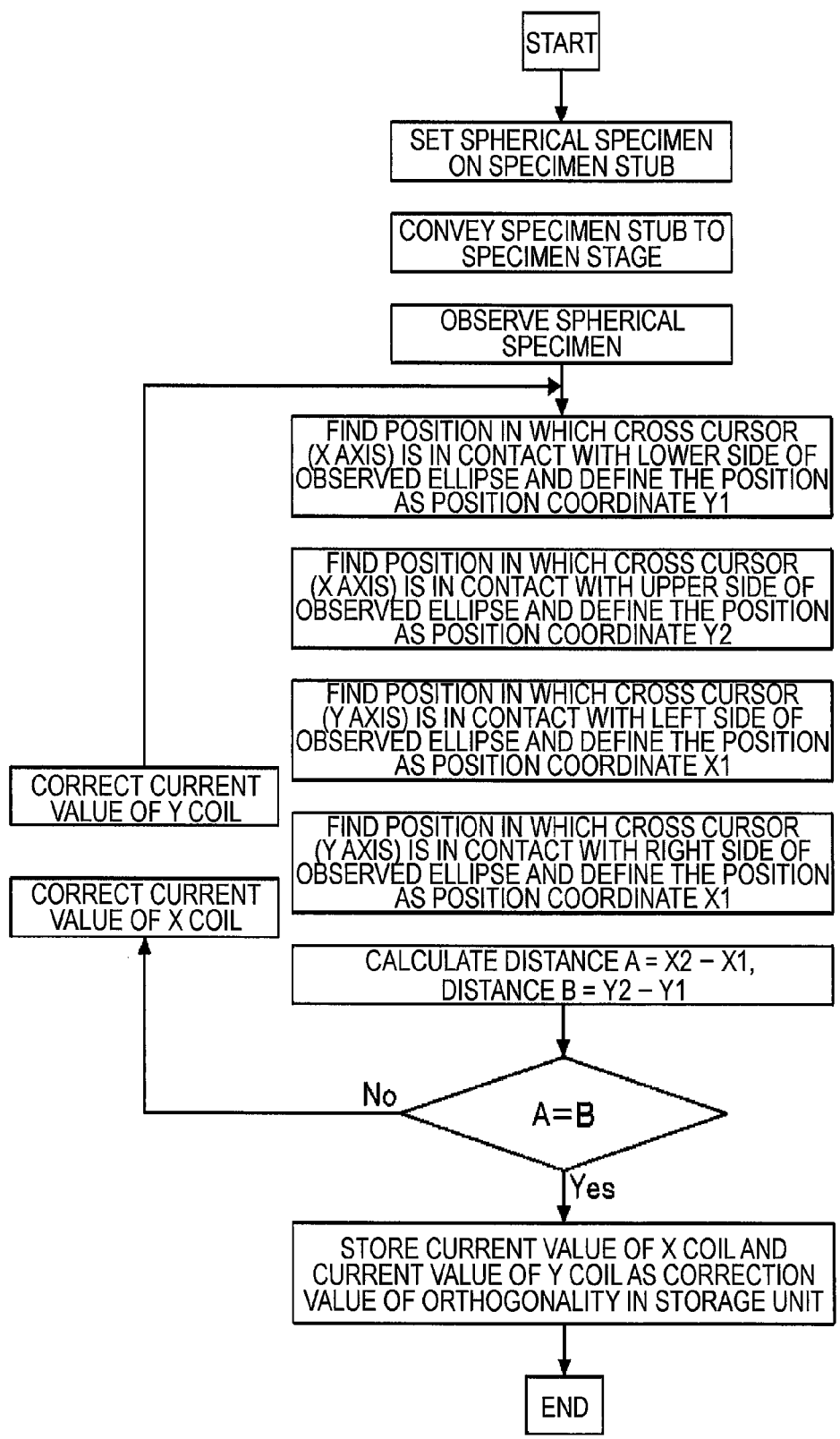
FIG. 4 is a chart illustrating an adjustment flow of the scanning deflector of the first embodiment.

FIG. 4 illustrates an adjustment flow of a scanning deflector of the present embodiment.

As described above, conventionally, the orthogonality of the Y direction with respect to the X direction has been adjusted by using a lattice specimen for defining orthogonality. In the present embodiment, the orthogonality is defined by using a spherical specimen instead of a lattice specimen.

First, a spherical specimen is placed on the specimen stub of the scanning electron microscope, and then conveyed into a specimen chamber by using the specimen stage. An example of the spherical specimen includes a polystyrene latex particle (normally, a PSL particle). A polystyrene latex particle is known as a perfectly spherical particle having an extremely uniform diameter. However, a spherical specimen that can be used is not limited to a polystyrene latex particle. After the specimen is conveyed, a secondary electron image or a reflection electron image of the spherical specimen is obtained, and then displayed on an orthogonal adjust operation window which is displayed on the image monitor 10. A selection button for displaying the operation window is displayed on a normal observation window on which the SEM image is displayed. When a user of the device presses the selection button, an orthogonal adjust select block shown in FIG. 5(A) is displayed.

The orthogonality adjustment operation can be performed automatically by the device control unit 11 and can also be performed manually by a user of the device. By selecting either a radio button "Auto ADJ." or a radio button "Manual ADJ.", and then clicking a "START" button shown in FIG. 5(A), the orthogonal adjust operation window shown in FIG. 5(B) is displayed, and the adjustment flow is thereafter started.

Hereinafter, a case where the manual operation is selected will be described.

Figure 5:
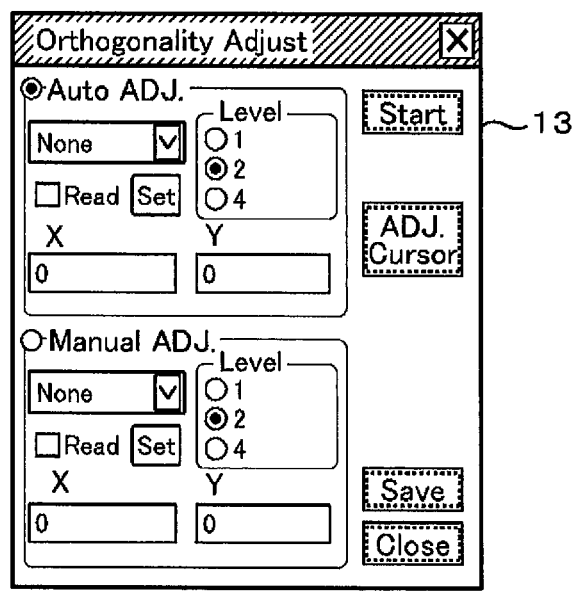
FIGS. 5(A) and 5(B) are diagrams illustrating operation windows used in adjustment of the scanning deflector of the first embodiment.
Figure 5:
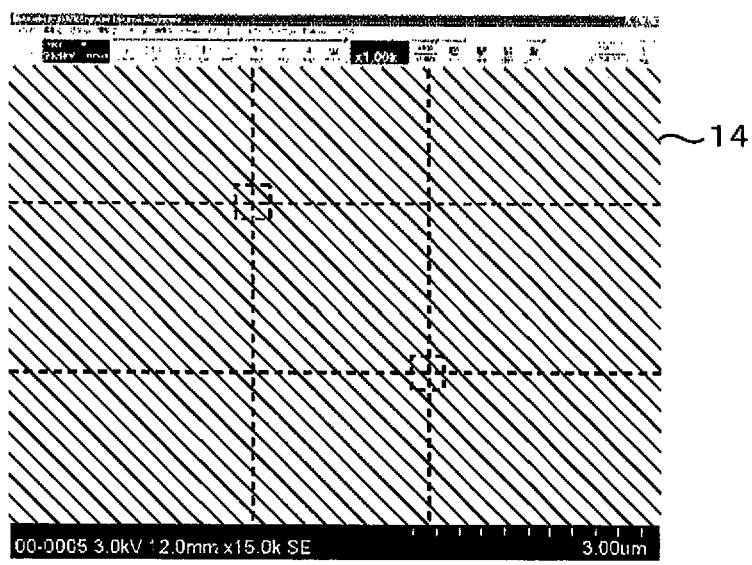

After the orthogonality adjustment flow is started, an obtained image whose orthogonality is in an initial state is displayed on the orthogonal adjust operation window shown in FIG. 5(B). At the same time, X cross cursors and Y cross cursors indicated by four straight lines in FIG. 3(A) are displayed on the orthogonal adjust operation window. Usually, the orthogonality is not appropriate in the initial state. Therefore, even when a spherical specimen is used, an elliptical image as shown in FIG. 3(A) is observed. On the other hand, since the X and Y cross cursors are straight lines which are generated by the device control unit 11, each of the X and Y cross cursors can be regarded as two straight lines which perfectly intersect at 90° on the window.

First, an operator finds a position in which a straight line in the X direction of an X cross cursor is in contact with the lower side of the elliptical observation image, and stores a Y position coordinate Y1 of the cursor at this point. In the same manner, the operator finds a position in which a straight line in the X direction of a second X cross cursor is in contact with the upper side of the elliptical observation image, a position in which a straight line in the Y direction of a first Y cross cursor is in contact with the left side of the elliptical observation image, and a position in which a straight line in the Y direction of a second Y cross cursor is in contact with the right side of the elliptical observation image, and then stores position coordinates of the respective cursors, namely, a Y position coordinate Y2, an X position coordinate X1, and an X position coordinate X2. The position coordinates are automatically stored in the device control unit 11 by, for example, double-click-action of a mouth.

After the contact position coordinates X1, X2, Y1 and Y2 between the X and Y cross cursors and the elliptical image are set, the device control unit 11 calculates a distance A of the ellipse in the X direction "A=X2−X1" and, a distance B of the ellipse in the Y direction "B=Y2−Y1" from the respective coordinates.

Next, the device control unit 11 executes a determination step for comparing the distance A with the distance B. In a case where A≠B, an operation for calculating the distance A and the distance B is performed after current values of the X deflection coil and the Y deflection coil are changed, and comparison of the distance A with the distance B is then performed. The same operation is continuously performed until A=B is satisfied. A pitch (increment) when changing the current values of the X deflection coil and the Y deflection coil is stored in the device (main body) control unit 11 or the scanning coil control unit 12. Further, the operator may set information on the pitch through an appropriate setting window.

When A=B is determined, the device control unit 11 transfers the current values of the X deflection coil and the Y deflection coil at this point to the scanning coil control unit 12 as correction values. The scanning coil control unit 12 stores the transferred correction values in the storage element inside thereof. Accordingly, the orthogonality adjustment flow is completed.

Although the setting of the coordinates X1, X2, Y1 and Y2 is manually performed in the above description, the adjustment flow shown in FIG. 4 can be easily automated. However, it is better that a final adjustment result can be confirmed by a human operator. Therefore, even when the automatic execution is selected in the select block shown in FIG. 5(A), the final result is displayed on the window shown in FIG. 5(B), and visually confirmed by a user of the device. Orthogonality obtained as a result of the automatic execution can be measured on the basis of the cross cursors on the window. When a displayed image can be observed as a circle, the orthogonality adjustment can be determined to be completed.

Second Embodiment

In a second embodiment, a description will be made with regard to a scanning electron microscope that adjusts the orthogonality by using an adjustment algorithm that is different from the adjustment algorithm in the embodiment 1. The overall configuration of the device is the same as that shown in FIG. 1, and a description thereof will therefore be omitted.

Figure 6:
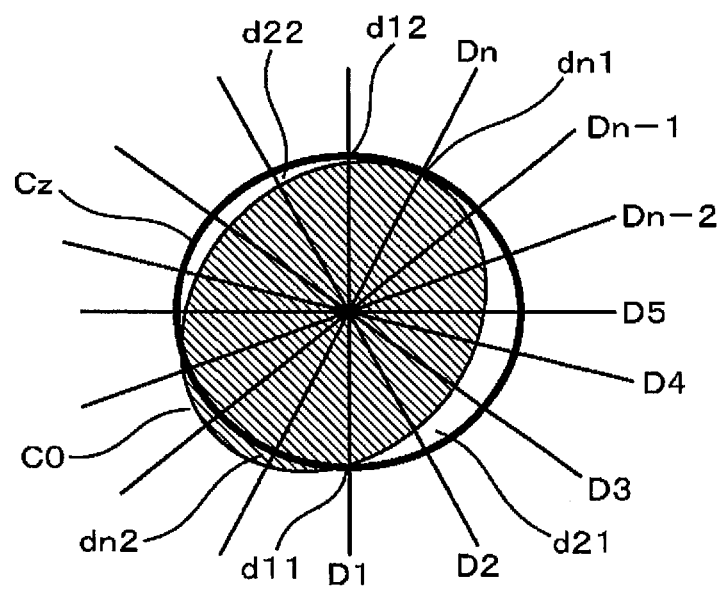
FIG. 6 is a diagram illustrating an adjustment principle of an adjustment algorithm of a scanning deflector of a second embodiment.

FIG. 6 illustrates a principle of an adjustment algorithm in the present embodiment. In a case where there are an observation image C0 of a spherical specimen and a perfect circle Cz having the same area as the observation image C0, when the orthogonality is smaller than a prescribed value, the observation image C0 and the perfect circle Cz should coincide with each other. In the adjustment algorithm in the present embodiment, a correction value of orthogonality is obtained by obtaining current values, of an X deflection coil and a Y deflection coil with which the observation image C0 and the perfect circle Cz coincide with each other.

Figure 7:
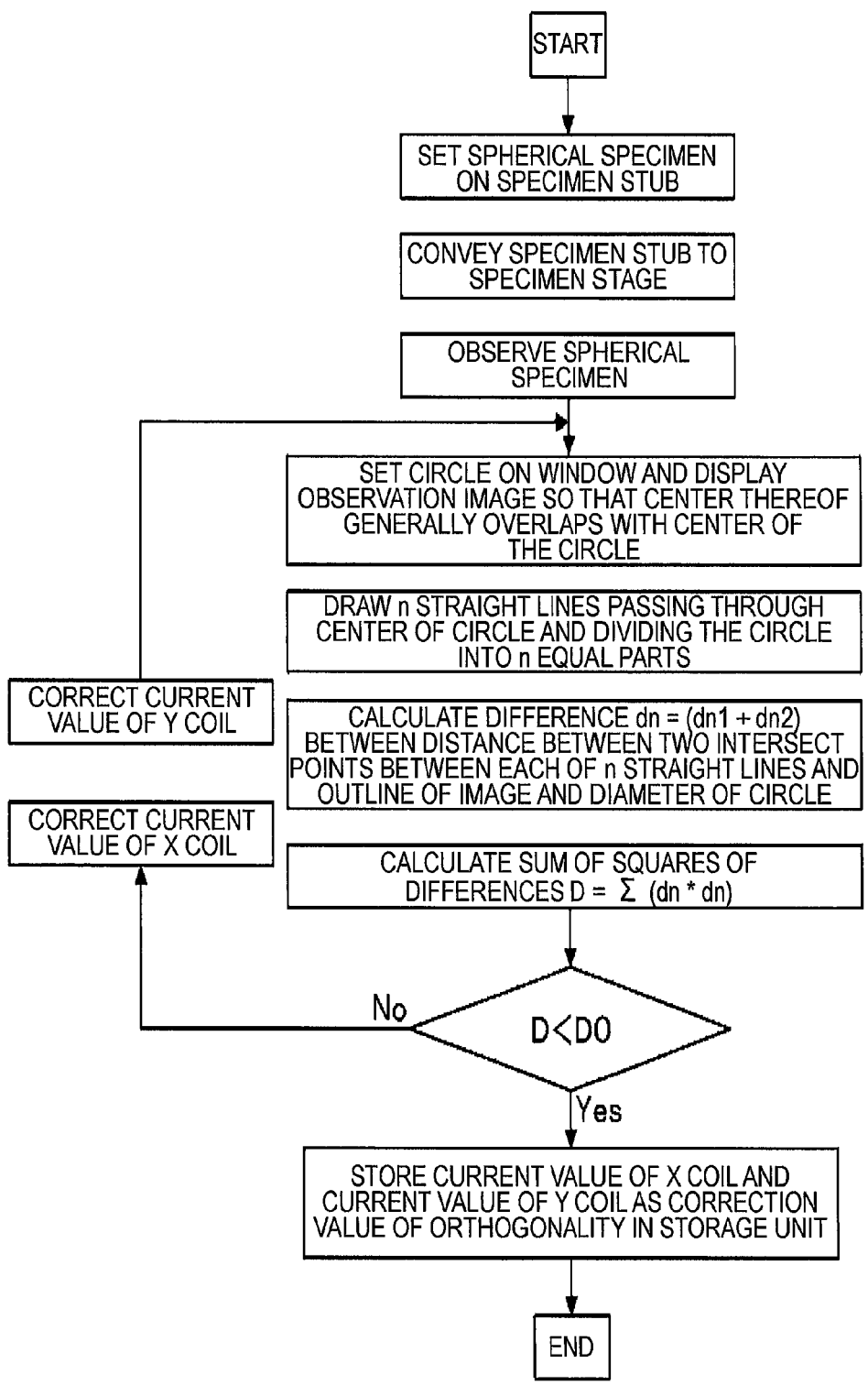
FIG. 7 is a chart illustrating an adjustment flow of the scanning deflector of the second embodiment.

FIG. 7 illustrates an adjustment flow of a scanning deflector of the second embodiment.

Steps from a first step of the flow through a step for displaying an observation image in an initial state on the orthogonal adjust operation window in FIG. 5(B) are the same as those in the embodiment 1, and a description thereof will therefore be omitted.

Next, the center of the perfect circle Cz and the center of the outline of the observation image C0 are brought to generally coincide with each other on the operation window. This operation can be manually or automatically performed.

Next, a plurality of straight lines (n straight lines, for example) passing through the center of the perfect circle Cz are arranged so as to divide the perfect circle Cz into n equal parts. These straight lines are defined as straight lines Dn. A sum of squares of differences dni each between a distance between two intersection points between the outline of the observation image C0 of the spherical specimen and each of the straight lines Dn and the diameter of the perfect circle Cz is calculated to thereby obtain a sum total D. A reason for employing the sum of squares is that deviation of the observation image C0 from the perfect circle Cz cannot be accurately represented due to the plus and minus signs when employing a simple sum of the differences.

Next, a determination is made as to whether the calculated sum total D which is a sum of squares is smaller than a predetermined threshold value D0. When the sum total D is larger than the threshold value D0, the current values of the X deflection coil and the Y deflection coil are changed by an appropriate pitch. Thereafter, the step for calculating the sum total D and the step for comparing the sum total D with the threshold value D0 described above are performed. By continuously performing the above steps until the sum total D becomes smaller than the threshold value D0, a correction value of orthogonality can be obtained. In the same manner as in the embodiment 1, the threshold value D0 and the pitch when changing the current values of the X deflection coil and the Y deflection coil are stored in the device (main body) control unit 11 or the scanning coil control unit 12. Further, an operator may set the above information through an appropriate setting window.

REFERENCE SIGNS LIST 1 electron gun
2 condenser lens
3 scanning coil
4 electron lens
5 specimen stub
6 specimen stage
7 chamber
8 secondary electron detector
9 image memory
10 image monitor
11 device control unit
12 scanning coil control unit
13 orthogonal adjust select block
14 orthogonal adjust operation window
C0 SEM observation image of spherical specimen
Cz perfect circle set on SEM image observation window
Dn straight line passing through center of perfect circle
dni difference between diameter of perfect circle and distance between two intersection points between straight line Dn and outline of SEM observation image of C0

The invention claimed is:
1. An adjustment method of a scanning deflector of a scanning electron microscope, the method comprising:
scanning, by the scanning electron microscope, a specimen with a primary electron beam generated by an electron gun using the scanning deflector to obtain an image of the specimen, wherein an adjustment amount of X and Y scanning directions is obtained so that all sides of a quadrangle composed of tangents in four points on an outline of an actual image of a spherical specimen have the same length.

2. An adjustment method of a scanning deflector of a scanning electron microscope, the method comprising:

scanning, by the scanning electron microscope, a specimen with a primary electron beam generated by an electron gun using the scanning deflector to obtain an image of the specimen, wherein an adjustment amount of X and Y scanning directions is obtained so that an outline of an actual image of a spherical specimen coincides with a perfect circle having the same area as the actual image of the spherical specimen, the perfect circle being generated by the computer.

* * * * *